United States Patent [19]
Teng

[11] Patent Number: 5,839,641
[45] Date of Patent: Nov. 24, 1998

[54] APPARATUS FOR PLACING AND ALIGNING SOLDER BALLS ONTO SOLDER PADS ON A SUBSTRATE FOR MANUFACTURING IC DEVICES

[75] Inventor: Kun-Tang Teng, Hsinchu, Taiwan

[73] Assignee: Industrial Technology Research Institute, Hsinchu, Taiwan

[21] Appl. No.: 816,504

[22] Filed: Mar. 13, 1997

Related U.S. Application Data

[63] Continuation-in-part of Ser. No. 521,313, Aug. 30, 1995, abandoned.

[51] Int. Cl.⁶ .............................. B23K 3/06; H01L 21/60
[52] U.S. Cl. .............................. 228/41; 228/246; 118/213
[58] Field of Search .............................. 228/39, 41, 56.3, 228/190.22, 244, 246; 118/213; 29/879, 884

[56] References Cited

U.S. PATENT DOCUMENTS

| | | |
|---|---|---|
| 5,118,027 | 6/1992 | Braun et al. .............................. 228/245 |
| 5,219,117 | 6/1993 | Lin .............................................. 228/41 |
| 5,284,287 | 2/1994 | Wilson et al. ........................... 228/254 |
| 5,431,332 | 7/1995 | Kirby et al. .............................. 228/246 |
| 5,704,536 | 1/1998 | Chen et al. .............................. 228/246 |

*Primary Examiner*—Samuel M. Heinrich
*Attorney, Agent, or Firm*—Finnegan, Henderson, Farabow, Garrett & Dunner, L.L.P.

[57] ABSTRACT

A solder ball placement and alignment apparatus for placing and aligning a plurality of solder balls onto solder pads on a multi-chip substrate includes a placement tray and a base seat. The placement tray includes a solder ball gate, means for controlling movement of the gate, a plurality of placement through holes that correspond to the solder pads on the substrate, and a plurality of alignment cavities disposed on the underside of the placement tray. The solder ball gate is slidably mounted to the placement tray and, when the gate is at a first position, an opening in the placement tray is uncovered thereby permitting solder balls to be removed when the placement and alignment apparatus is tilted toward the direction of the opening. When the gate is at a second position, the opening of the placement tray is covered. The movement of the gate is controlled by an electromagnet and associated control circuit means or a mechanical device.

11 Claims, 7 Drawing Sheets

APPARATUS FOR PLACING AND ALIGNING SOLDER BALLS ONTO SOLDER PADS ON A SUBSTRATE FOR MANUFACTURING IC DEVICES

CROSS REFERENCE TO RELATED APPLICATION

This application is a continuation-in-part of U.S. patent application Ser. No. 08/521,313 filed on Aug. 30, 1995, now abandoned, the content of which is relied upon and incorporated by reference.

BACKGROUND OF THE INVENTION

1. Field of the Invention

This invention generally relates to the manufacturing and packaging of semiconductor devices and, specifically, an improved apparatus for aligning and placing solder balls onto solder pads on a multi-chip substrate for fabrication and packaging of semiconductor devices.

2. Description of the Related Art

To handle and align a large number of solder balls onto solder pads on a semiconductor substrate, expensive manufacturing equipment often is required to be used. Not only does this increase manufacturing costs, but also it hinders manufacturing processes to be efficiently carried out in a fully automated manner. Many surface mounting technologies, such as solder bumping technology, pad array carrier, and ball grid array packaging, for the manufacturing and packaging of semiconductor devices involve the use of wire bonding and solder balls. As integrated circuits ("ICs") become smaller in size and higher in circuit density, all the while handling more complicated functions and processes, very fine wires and a large number of small solder balls, e.g., 0.03 inches in diameter, are used in the manufacturing and packaging processes of ICs. For example, three hundred and sixty-one solder balls are required for a package of 19 by 19 solder pads, and these solder balls need to be arranged and aligned onto solder pads with a distance of approximately 0.05 inches between each other. The difficulty in handling this many small solder balls with the required alignment precision can be easily appreciated. In addition, to improve productivity, manufacturing processes are often automated. Several conventional techniques have attempted to devise manufacturing processes that would allow automation in the alignment and placement of solder balls onto corresponding solder pads. Even though some prior techniques may have achieved automation, the processes involved require the use of high cost equipment and complicated operational procedures, and they are time consuming.

Several prior art patents have described different techniques to achieve precision in the placement of solder balls. The first is a process for fabricating a plurality of solder joints from a low melting point solder paste and high melting point solder balls, as described in U.S. Pat. No. 5,118,027 ('027 patent) of Braun et al., entitled "Method of Aligning and Mounting Solder Balls to a Substrate" issued on Jun. 2, 1992. FIGS. 3A, 3B, 3C, and 3D of the '027 patent are reproduced herein as FIGS. 1A, 1B, 1C, and 1D, respectively. Referring to FIGS. 1A to 1D, high melting point solder balls 11 are positioned in cavities 23 of alignment boat 25, and vacuum force is generated to hold the boat and solder balls in place. Then an amount of low melting point solder paste is "screened" onto the solder balls 11 to form a solder paste pad 15. An alignment plate 27 is placed over alignment boat 25 to roughly align the solder ball matrix with a substrate 17. Substrate 17 is placed through the self-alignment plate 27 onto solder paste pad 15. Sufficient force is applied to bring substrate 17 in contact with all of solder paste pads 15. Finally, the substrate and the alignment boat assembly are processed through a furnace for solder paste reflow. This method requires an alignment boat having a plurality of cavities and the use of a vacuum pump to generate the required vacuum in each cavity to hold the solder balls in place. Thus, this method is complicated and requires the use of a vacuum generating equipment that is generally expensive and difficult to maintain and service.

Figure 1A:
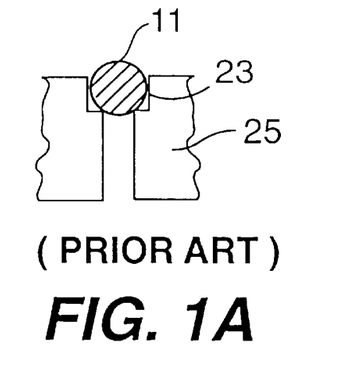
FIGS. 1A to 1H depict apparatuses disclosed in prior art patents for handling and placing solder balls.
Figure 1B:
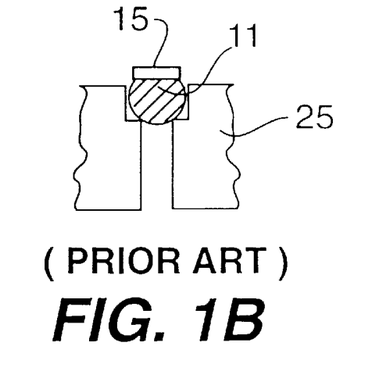
Figure 1C:
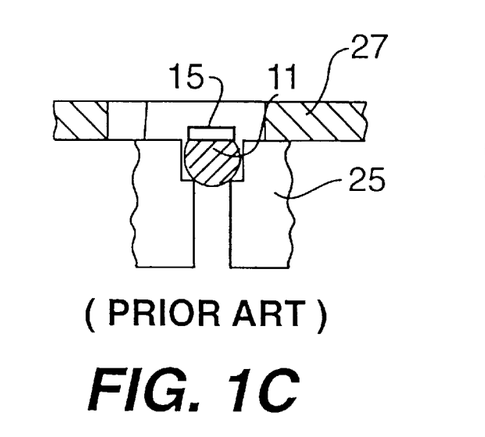
Figure 1D:
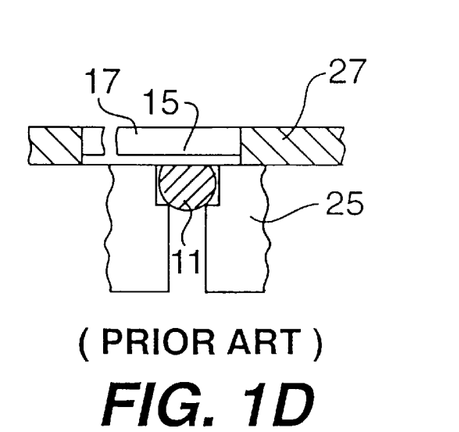
Figure 1E:
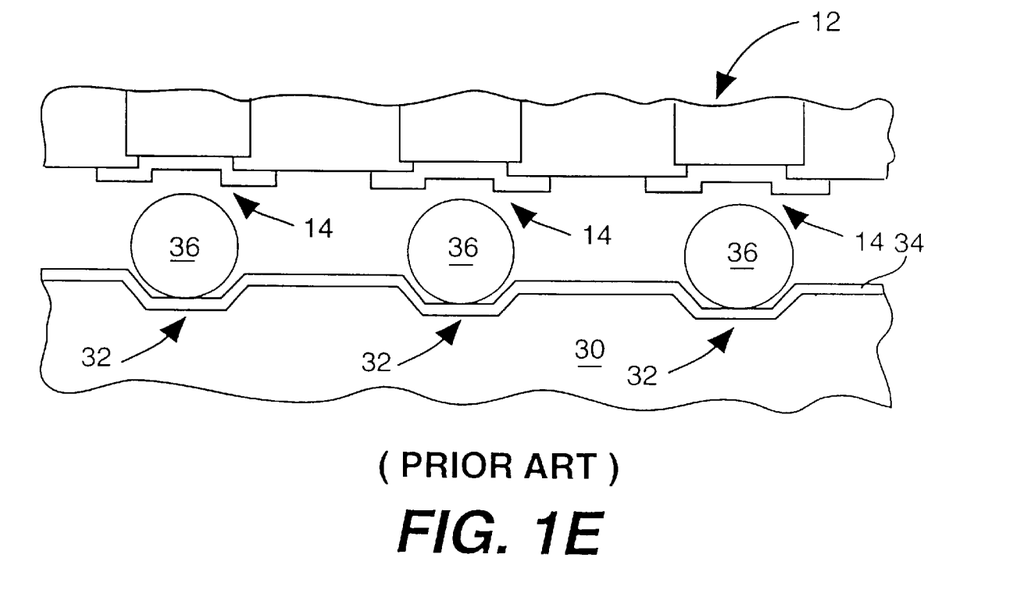

Lin describes a method for transferring solder balls without using solder evaporation techniques in U.S. Pat. No. 5,219,117 ('117 patent), entitled "Method of Transferring Solder Balls onto a Semiconductor Device". The '117 patent was issued on Jun. 15, 1993, and FIG. 4 of the patent is reproduced herewith as FIG. 1E. Referring to FIG. 1E, a plurality of semiconductor dies are formed on a semiconductor substrate, and each die has a plurality of bond pads 14. The assembly is positioned so that each of the bond pads corresponds to and is opposed to a recess 32 formed in a transfer substrate 30. Pre-formed solder balls 36 are placed in the recesses. The semiconductor substrate assembly and the transfer substrate assembly including a non-wettable surface 34 are positioned such that each solder ball aligns to, and is in contact with, a bond pad. The recesses and bond pads provide a mechanism for handling solder balls. However, fabrication of recesses and corresponding bond pads may be complicated and costly. Additionally, aligning the transfer substrate assembly with the semiconductor substrate assembly must be performed with precision. The recesses and bond pads of the '117 patent do not appear to provide a method for conveniently aligning these two assemblies with precision.

Figure 1F:
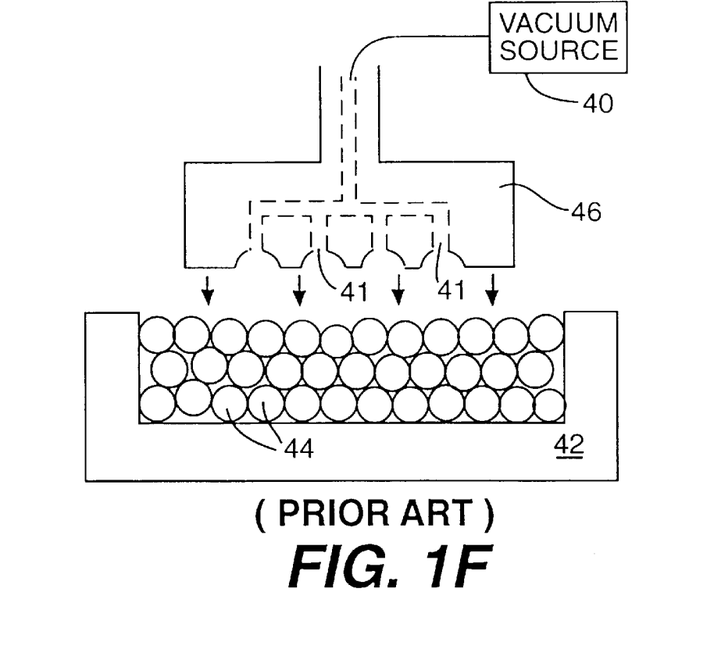
Figure 1G:
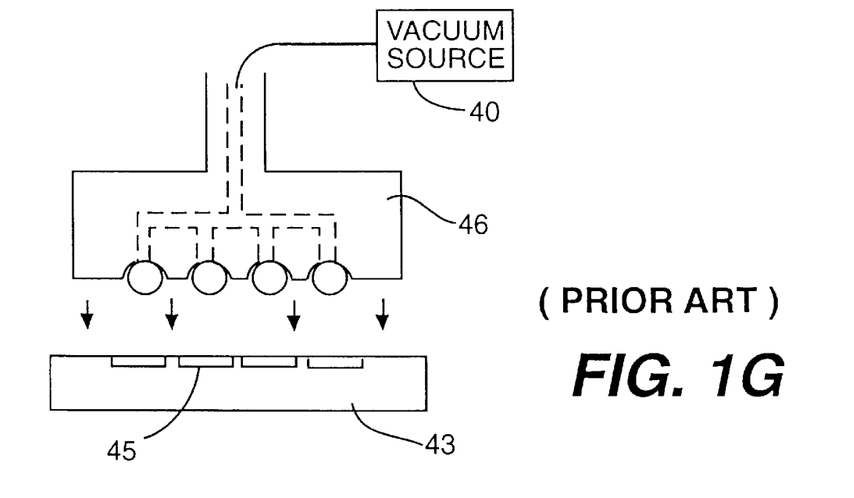
Figure 1H:
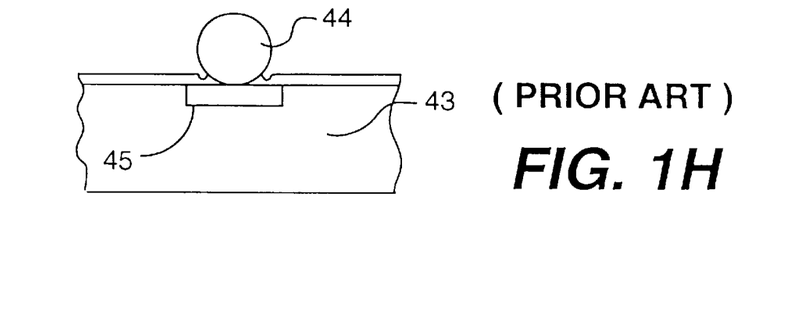

Wilson et al. in U.S. Pat. No. 5,284,287, entitled "Method For Attaching Conductive Balls to a Substrate" issued on Feb. 8, 1994, describes a method for solder ball placement employing a vacuum pick-up tool. FIGS. 3, 6, and 7 of this prior art patent are reproduced herewith as FIGS. 1F, 1G, and 1H, respectively. Referring to FIGS. 1F–1H, a vacuum pick-up tool 46, having a plurality of solder ball receiving cavities 41, picks up a plurality of solder balls 44 from a container 42 with suction force generated from a vacuum source 40. The solder balls are held in the cavities by the suction force while the vacuum pick-up tool is moved over a substrate 43 which has a plurality of recessed solder pads 45 to receive the solder balls. Again, this method requires a vacuum pump and the fabrication of a plurality of recessed pads. The fabrication processes are complicated and the equipment is expensive. Furthermore, this invention does not provide a convenient method for accurately aligning the vacuum pick-up tool with the substrate.

Therefore, a need still exists in the art of semiconductor manufacturing and packaging to provide a fabrication method to overcome the previously discussed disadvantages of conventional techniques. Specifically, a fabrication method should desirably use low cost equipment, simple operational procedures, and convenient automated mass-production manufacturing processes.

SUMMARY OF THE INVENTION

Additional features and advantages of the invention will be set forth in the description which follows, and in part will be apparent from the description, or may be learned by practice of the invention. The objectives and other advantages of the invention will be realized and attained by the apparatus particularly pointed out in the written description and claims hereof, as well as the appended drawings.

To achieve these and other advantages, and in accordance with the purpose of the invention as embodied and broadly described, there is provided a solder ball placement and alignment apparatus for placing and aligning a plurality of solder balls onto a plurality of solder pads on a multi-chip substrate, comprising: a placement tray having a plurality of alignment cavities disposed on an underside thereof, having a plurality of placement through holes, each corresponding to one of the plurality of solder pads and each being larger than the diameter of the solder balls, and having a solder ball gate, the solder ball gate covering an opening in the placement tray in a second position and uncovering the opening in a first position; means associated with the placement tray for controlling movement of the solder ball gate; and a base seat for positioning beneath the multi-chip substrate with the substrate positioned between the base seat and the placement tray, the base seat having a plurality of alignment pins corresponding to the alignment cavities.

In another aspect, the invention includes a solder ball collection box having substantially the same dimensions as the placement tray such that when the placement and alignment apparatus of the subject invention are assembled, the opening of the placement tray is directly over the collection box.

In yet another aspect, the associated means for controlling movement of the gate of the present invention includes an electromagnet and associated circuit means or a mechanical gear device, both of which may be programmed to operate at predetermined time intervals.

It is to be understood that both the foregoing general description and the following detailed description are exemplary and explanatory and are intended to provide further explanation of the invention as claimed.

The accompanying drawings are included to provide a further understanding of the invention and are incorporated in and constitute a part of this specification, illustrate several embodiments of the invention and, together with the description, serve to explain the principles of the invention.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings.

DETAILED DESCRIPTION OF THE PREFERRED EMBODIMENTS

In accordance with disclosed embodiments of the present invention, there is provided a solder ball placement and alignment apparatus for placing and aligning a plurality of solder balls onto solder pads on a multi-chip substrate, which generally has a plurality of alignment holes and a plurality of slots disposed therein. The apparatus includes a placement tray and a base seat. The length of the placement tray may be longer than that of the multi-chip substrate, and the placement tray further includes a solder ball gate, means for controlling movement of the gate, a plurality of placement through holes that correspond to the solder pads on the substrate, and a plurality of alignment cavities disposed on the underside of the placement tray. The solder ball gate is slidably mounted to the placement tray and, when the gate is at a first position, an opening of the placement tray is uncovered thereby permitting solder balls to be removed by tilting the placement and alignment apparatus toward the direction of the opening. When the gate is at a second position, it covers the opening in the placement tray. The movement of the gate may be controlled by an electromagnet and circuit means or a mechanical device.

The base seat of the placement and alignment apparatus has a plurality of alignment pins that correspond to the alignment cavities in the placement tray. When the placement tray and the base seat are assembled with the alignment pins inserting through the alignment holes of the substrate and into the alignment cavities, the assembled components securely hold the multi-chip substrate therebetween. The size and dimensions of the apparatus may be constructed according to the size of the substrate.

The placement and alignment apparatus may further include a solder ball collection box to collect solder balls that have fallen through the opening of the placement tray as the apparatus is tilted toward the direction of the opening. The dimensions of the solder ball collection box are substantially the same as those of the placement tray such that the opening of the placement tray is directly over the solder ball collection box.

Figure 2A:
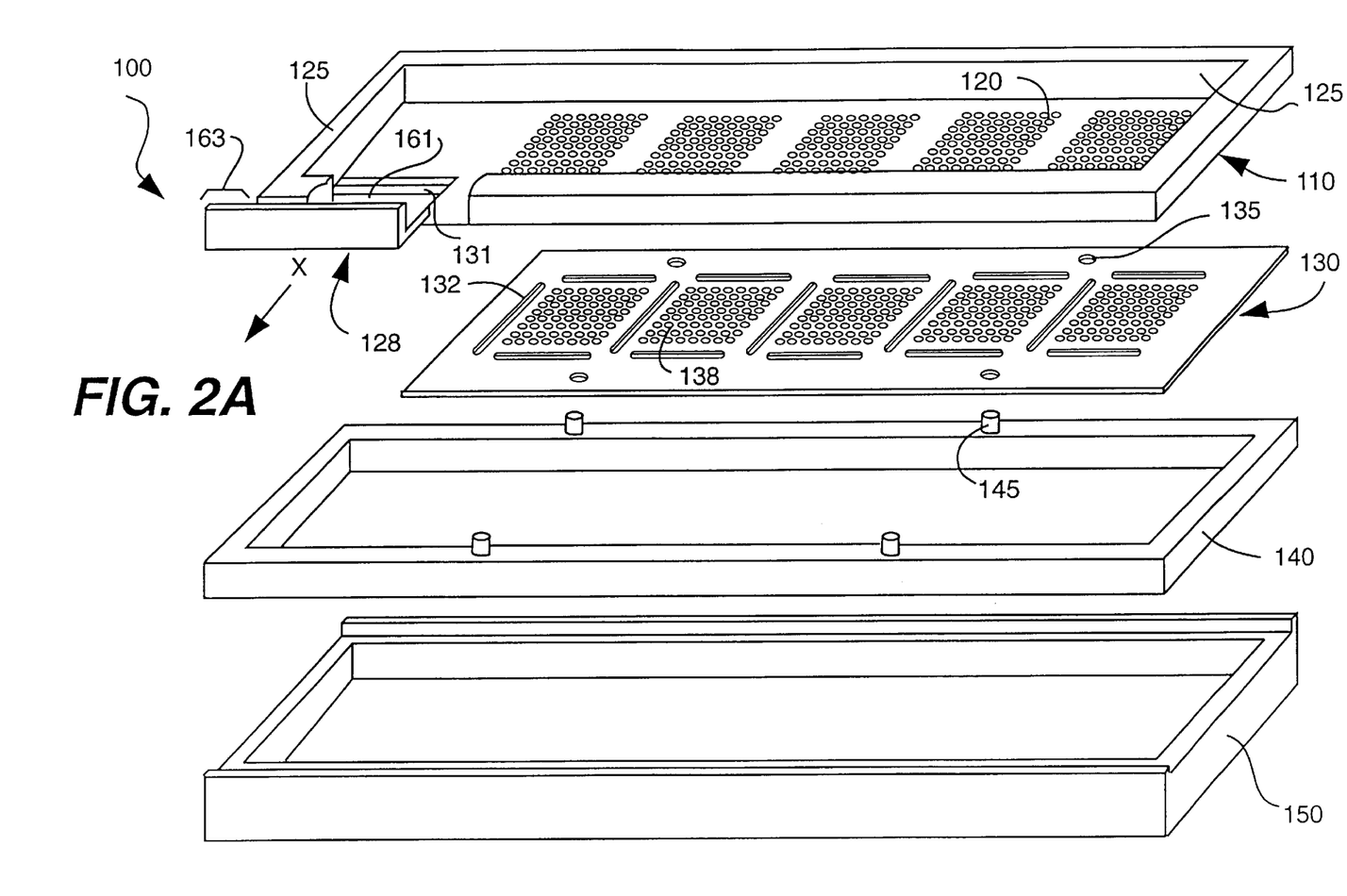
FIG. 2A is a perspective view of solder ball placement and alignment apparatus in accordance with an embodiment of the present invention.

FIG. 2A depicts a perspective view of a solder ball placement and alignment apparatus 100 in accordance with an embodiment of the present invention. The top component of the placement and alignment apparatus is a solder ball placement tray 110 including a plurality of placement through holes 120 for solder ball placement. The placement holes 120 correspond to a plurality of solder pads 138 on a multi-chip printed circuit board (PCB) substrate 130 to be placed directly underneath placement tray 110. As with many multi-chip substrates, PCB substrate 130 includes a plurality of alignment holes 135 and a plurality of slots 132, in addition to having a plurality of solder pads 138.

Each of placement holes 120 of placement tray 110 is slightly larger than the diameter of the solder balls so as to allow one solder ball to drop through and rest on one of the plurality of solder pads 138. Because of the proximity of solder pads 138 to placement holes 120, only one solder ball is able to be placed on each solder pad. Placement tray 110 is substantially rectangular and surrounded by protective walls 125 to prevent the solder balls from rolling out from the placement tray. The respective widths of placement tray 110 and substrate 130 are substantially the same, while placement tray 110 including an extended portion extending in length beyond substrate 130.

Placement tray 110 further includes a solder ball gate 128 slidably mounted to placement tray 110. Solder ball gate 128 has a vertical, or lip, portion 160 and a horizontal portion 161. The terms "vertical" and "horizontal" have their ordinary meaning with respect to elements of the present embodiment as viewed in the figures. Vertical portion 160 includes a portion 163 that extends beyond the end of placement tray 110. Solder ball gate 128 is preferably metallic, or at least metallic in portion 163 of vertical portion 160. Solder ball gate 128 moves along a horizontal direction x through a slit 127, as shown in FIG. 3B, in a protective wall 125 of placement tray 110. FIG. 2A also shows that when solder ball gate 128 is at a first position, an opening 131 of placement tray 110 is uncovered. Opening 131 is located in the extended portion of placement tray 100 and at a position clear of substrate 130 such that solder balls that have not fallen through placement holes 120 and onto solder pads 138 can be removed from placement tray 110 through opening 131 as placement and alignment apparatus 100 is tilted toward the direction of the opening.

Figure 2B:
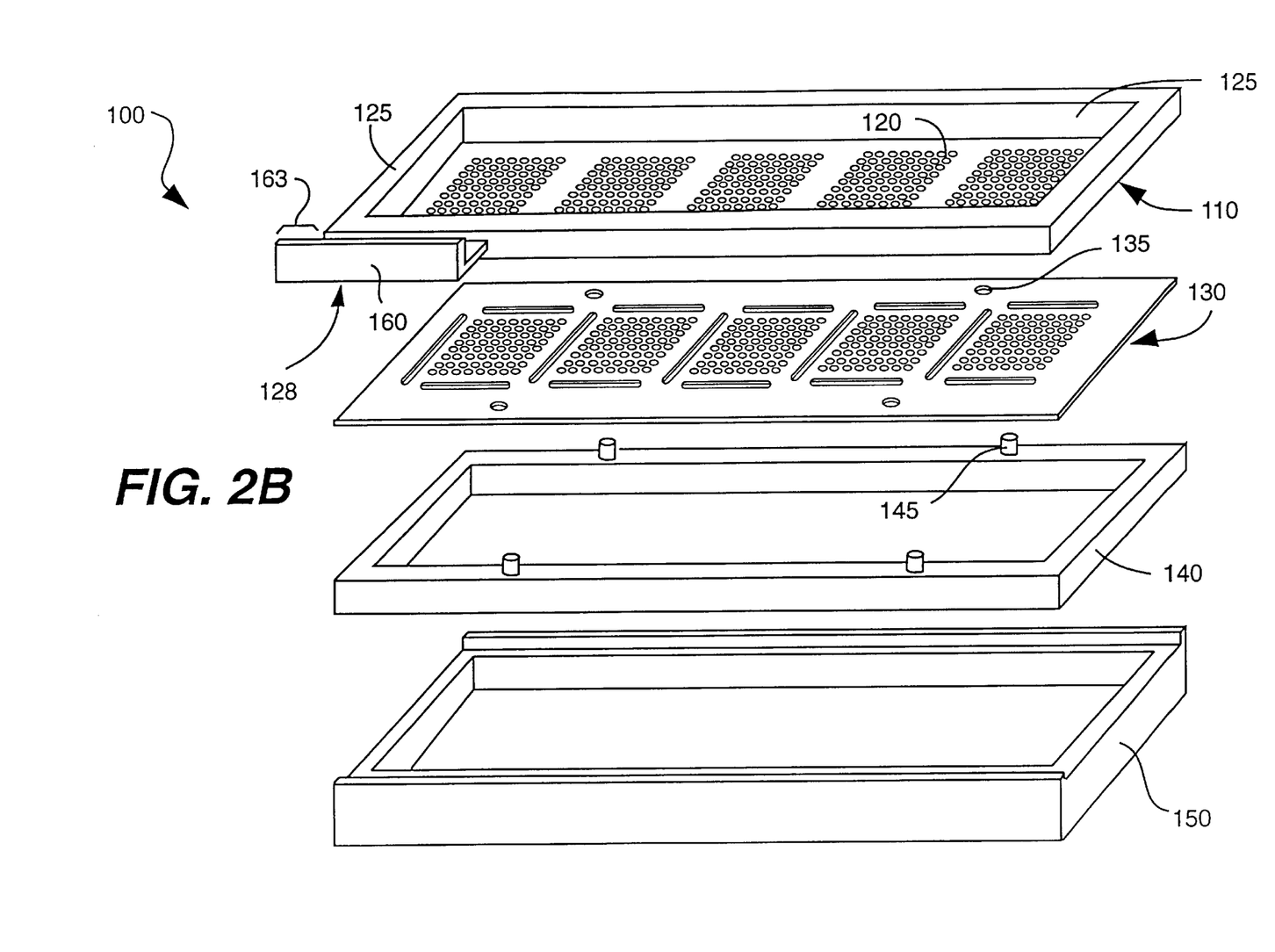
FIG. 2B is a perspective view of solder ball placement and alignment apparatus in accordance with another embodiment of the present invention.

FIG. 2B shows another embodiment of the present invention in which the dimensions of placement tray 110 and PCB substrate 130 are substantially the same. In this embodiment, placement tray 110 is constructed such that opening 131 aligns with one of the plurality of slots 132 of substrate 130 thereby allowing solders balls to be removed from placement tray 110 when solder ball gate 128 is at the first position by tilting apparatus 100 toward opening 131 of placement tray 110.

Figure 3A:
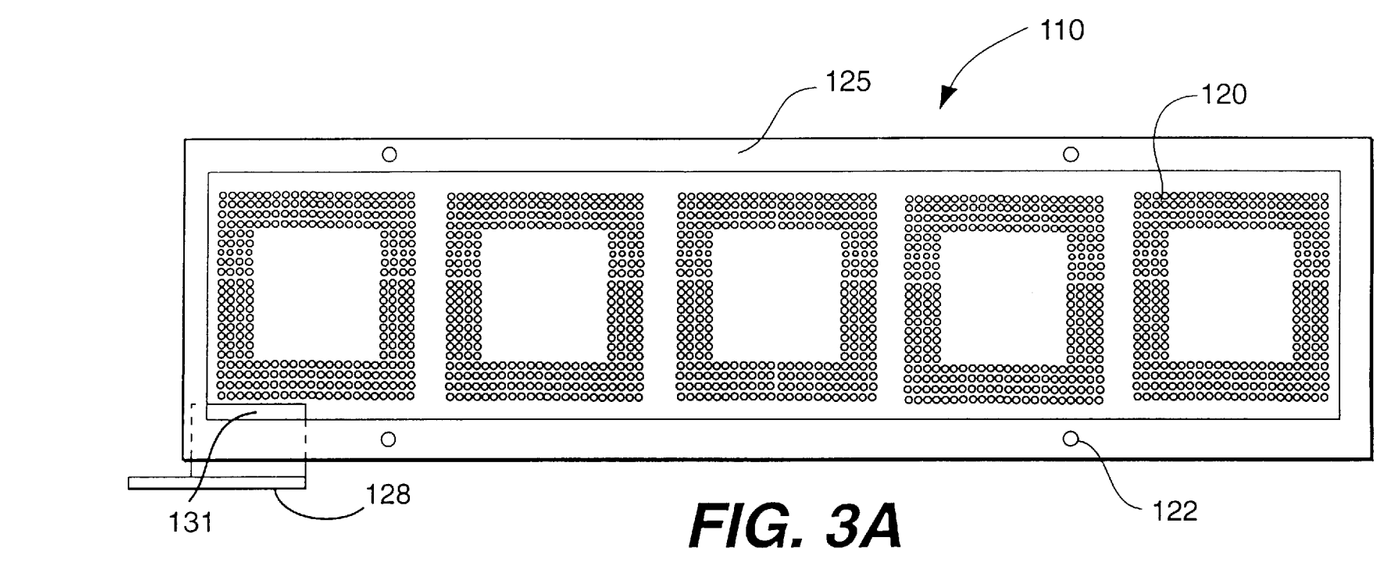
FIGS. 3A and 3B depict the bottom and side views, respectively, of a placement tray shown in FIG. 2.
Figure 3B:
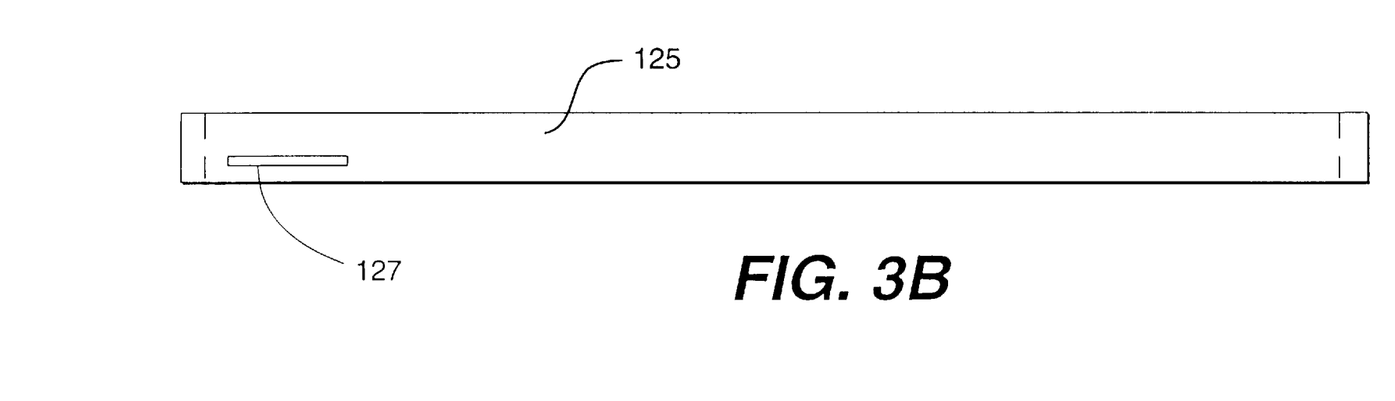

Referring to FIG. 3A, which is a bottom view of placement tray 110, a plurality of alignment cavities 122 are disposed in the underside of placement tray 110 for connecting with a base seat 140 as shown in FIG. 2A. Base seat 140 is a frame having a plurality of alignment pins 145 corresponding to alignment cavities 122 in placement tray 110. Placement tray 110 and base seat 140 are assembled with alignment pins 145 inserted through placement holes 135 of substrate 130 and into alignment cavities 122 of placement tray 110. The resulting assembly securely holds substrate 130 therebetween and accurately aligns placement tray 110 with substrate 130 which in turn aligns placement holes 120 of placement tray 110 with solder pads 138. The size and dimensions of apparatus 100 may be constructed according to the size of the substrate.

In another embodiment of the present invention, placement and alignment apparatus 100 may further include a solder ball collection box 150 as shown in FIG. 2, having a top opening that fits directly underneath base seat 140. Solder ball collection box 150 receives solder balls that have fallen through opening 131 of placement tray 110 as placement and alignment apparatus 100 is tilted toward the direction of the opening.

When placement and alignment apparatus 100 of the present invention is assembled and solder ball gate 128 is moved to a second position covering opening 131 of placement tray 110, a plurality of solder balls are supplied to the placement tray. Through rolling and shaking movements of the apparatus, the action of which may be accomplished manually by an operator or automatically by a mechanical device on which the apparatus rests, the solder balls are spread out over the entire area of the placement tray. Some of the solder balls drop through the placement holes and onto the plurality of solder pads on the substrate. After solder ball gate 128 is moved to the first position, the remaining solder balls are then removed from placement tray 110 by tilting apparatus 100 toward the direction of opening 131. This tilting movement may also be accomplished either manually or mechanically. The mechanical device may be controlled by a timer that dictates the time interval between the "rolling and shaking" and tilting movements.

FIGS. 3A and 3B show the bottom and side views of a preferred embodiment of placement tray 110 of the present invention. Placement tray 110 includes five sets of placement holes 120 to place solder balls for five sets of solder pads. The underside of placement tray 110 includes a plurality of alignment cavities 122. The numbers shown in FIG. 3A are for illustrative purposes only and should not be construed as limitations on the scope of the subject invention. FIG. 3B shows slit 127 in the one of protective walls 125 of placement tray 110.

Figure 4A:
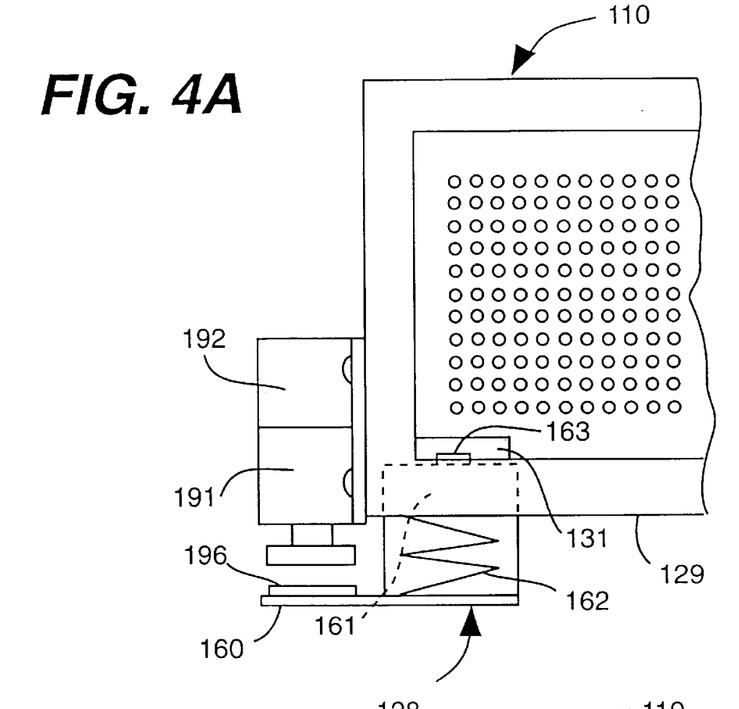
FIGS. 4A and 4B depict an embodiment of means for controlling the movement of a solder ball gate with the gate at a first and a second position, respectively.
Figure 4B:
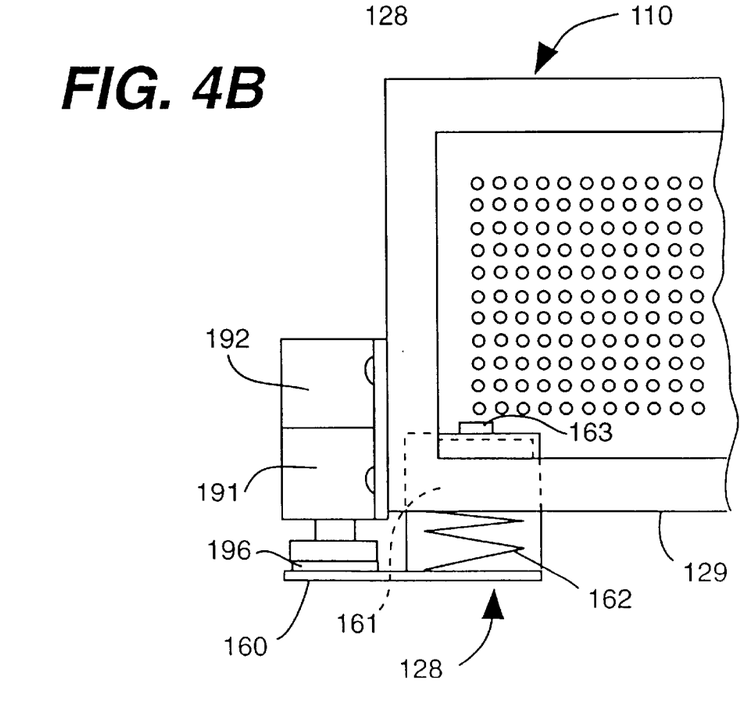

FIGS. 4A and 4B depict an embodiment of means for controlling the movement of solder ball gate 128 between a first and a second position, respectively. In one embodiment of the subject invention as shown in FIG. 4A, an elastic means 162, such as a coil or a spring, is attached between vertical portion 160 of solder ball gate 128 and the one of protective walls 125 positioned along a front edge of placement tray 110, this frontal wall being designated wall 129 in the figures. Solder ball gate 128 is moved to the first position shown in FIG. 4A by elastic means 162 in a direction away from placement tray 110. A stopper 163 is mounted at the end of horizontal portion 161 of solder ball gate 128 to prevent the solder ball gate from being completely withdrawn and separated from placement tray 110. Opening 131 of placement tray 110 is uncovered, and therefore any solder balls that have not fallen through alignment holes 120 and onto solder pads 138 of substrate 130 are removed by tilting placement and alignment apparatus 100 toward the direction of the opening. The solder balls that have fallen through opening 131 are collected in a solder ball collection box.

When the solder ball gate is at the second position as depicted in FIG. 4B, solder ball gate 128 is pulled toward placement tray 110 by a magnetic force generated by electromagnet 191 such that horizontal portion 161 of solder ball gate 128 covers opening 131 of placement tray 110 to prevent any solder balls from falling through the opening. Electromagnet 191 is controlled by circuit means 192. In addition, attached to vertical portion 160 of solder ball gate 128 is a metallic object 196 such that metallic object 196 will be drawn toward placement tray 110 by the force generated by electromagnet 191. This in turn draws solder ball gate 128 toward placement tray 110 to the second position. Alternatively, if vertical portion 160 of solder ball gate 128 is metallic, then metallic object 196 is not required.

Figure 5:
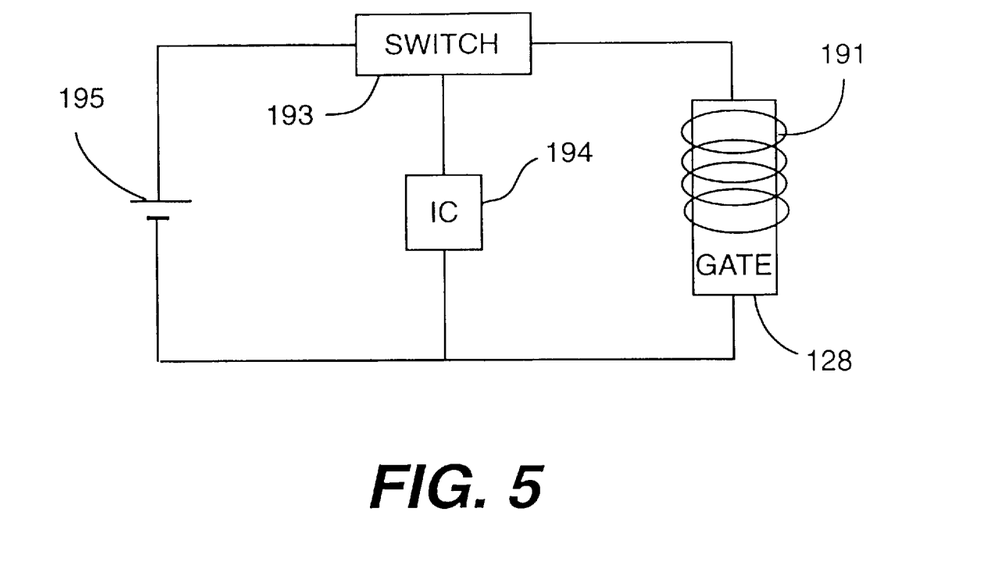
FIG. 5 depicts an embodiment of circuit means of the means for controlling the movement of the solder ball gate.

FIG. 5 depicts an embodiment of means for controlling movement of solder ball gate 128. Controlling means includes an electromagnet 191 and circuit means 192, both of which are attached to the protective wall 125 adjacent frontal wall 129 of placement tray 110 as shown in FIGS. 4A and 4B. Circuit means 192 comprises a switch 193 and an integrated circuit 194. Before solder balls are placed on placement tray 110, integrated circuit 194 sends a signal to switch 193 to close so as to enable an external power source 195 to supply power to electromagnet 191 thereby activating the electromagnet. Magnetic force generated by electromagnet 191 pulls solder ball gate 128 toward placement tray 110. At this second position, solder ball gate 128 is in contact with electromagnet 191 and horizontal portion 161 of the solder ball gate covers opening 131 of placement tray 110. After solder balls are placed onto the placement tray and after rolling and shaking movements to place the solder balls, integrated circuit 194 sends a signal to switch 193 to open so as to disconnect the power from outside power source 195. As a result, electromagnet 191 no longer exerts a force on solder ball gate 128. In the absence of this force, elastic means 162 propels solder ball gate 128 away from placement tray 110, returning the solder ball gate to the first position. Excess solder balls are then removed from the placement tray by tilting the placement and alignment apparatus toward the direction of opening 131 of placement tray 110.

Integrated circuit 194 that controls switch 193 may be programmed to send signals at predetermined intervals. For example, integrated circuit 194 may be programmed to send signals to the switch such that the solder ball gate is in the first position for 15 seconds and in the second position for three seconds. Alternatively, the integrated circuit may be controlled by a timer that dictates the time interval solder ball gate 128 remains in the first and second positions.

Figure 6:
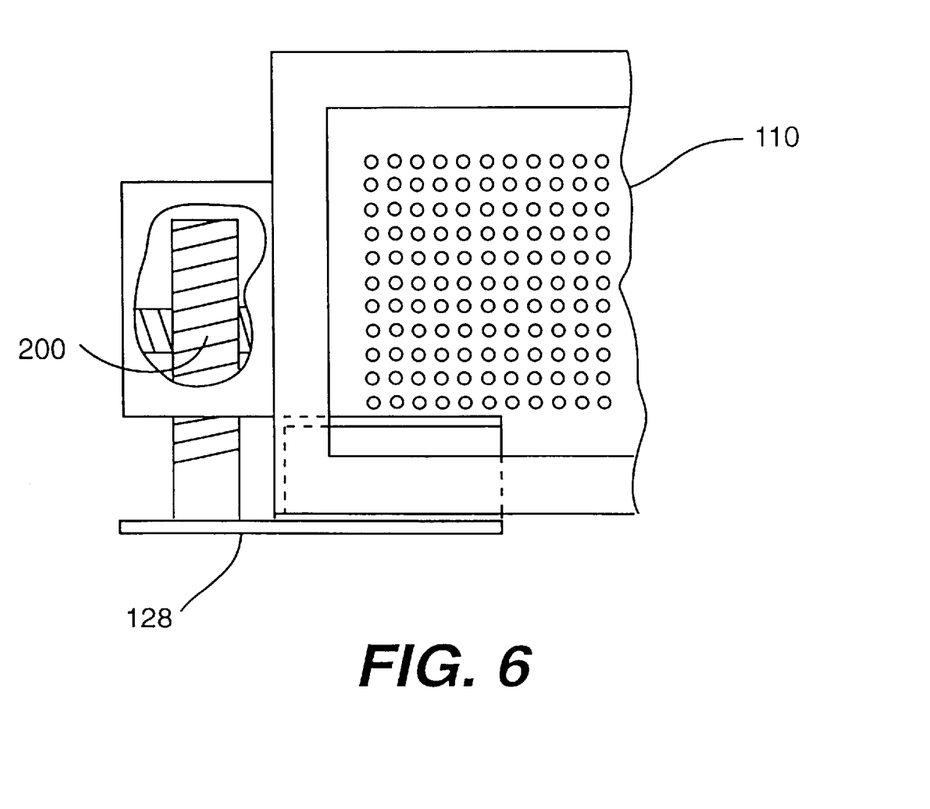
FIG. 6 depicts another embodiment of the means for controlling the movement of the solder ball gate.

FIG. 6 depicts another embodiment of means for controlling movement of the solder ball gate. In this embodiment, solder ball gate 128 and means for controlling movement of the solder ball gate are mechanically interconnected. The controlling means is a mechanical gear device including a worm gear 200, driven by a motor (not shown), to move solder ball gate 128 between the first and second positions. Similarly, the gear device may be controlled by a timer that dictates the time interval solder ball gate 128 remains in the first and second positions.

Therefore, the placement and alignment apparatus of the present invention is able to place and align solder balls onto a plurality of solder pads on a multi-chip substrate with a simplified mode of operation and with precision. The present invention thus provides a solder ball placement and alignment apparatus that is simple to operate and conducive to automation at low cost.

It will be apparent to those skilled in the art that various modifications and variations can be made in the disclosed product and process of using the product without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A solder ball placement and alignment apparatus for placing and aligning a plurality of solder balls onto a plurality of solder pads on a multi-chip substrate, comprising:

a placement tray having a plurality of alignment cavities disposed on an underside thereof, having a plurality of placement through holes, each corresponding to one of said plurality of solder pads and each being larger than the diameter of said solder balls, and having a solder ball gate, said solder ball gate covering an opening in said placement tray in a second position and uncovering said opening in a first position;

means associated with said placement tray for controlling movement of said solder ball gate; and a base seat for positioning beneath the multi-chip substrate with the substrate positioned between said base seat and said placement tray, said base seat having a plurality of alignment pins corresponding to said alignment cavities.

2. The solder ball placement and alignment apparatus as claimed in claim 1 further comprising a solder ball collection box disposed beneath said base seat for collecting solder balls falling through the opening uncovered by said solder ball gate.

3. The solder ball placement and alignment apparatus as claimed in claim 1, said means for controlling movement of said solder ball gate comprising an electromagnet, switch means for selectively connecting said electromagnet to an external power supply, and means for controlling said switch means.

4. The solder ball placement and alignment apparatus as claimed in claim 1, said means for controlling movement of said solder ball gate being mechanically interconnected to said gate and comprising a worm gear and a motor that drives said worm gear to move said gate between the first position and the second position.

5. The solder ball placement and alignment apparatus as claimed in claim 1, said placement tray including an extended portion extending in length beyond the multi-chip substrate, and said opening of said placement tray being located in said extended portion.

6. The solder ball placement and alignment apparatus as claimed in claim 1 wherein said means for controlling movement of said solder ball gate is programmed to move said solder ball gate at predetermined time intervals.

7. A solder ball placement and alignment apparatus for placing and aligning a plurality of solder balls onto a plurality of solder pads on a multi-chip substrate, said substrate having a plurality of alignment holes, comprising:

a placement tray having a plurality of alignment cavities disposed on an underside thereof, said alignment cavities corresponding to said plurality of alignment holes of the substrate, having a plurality of placement through holes each corresponding to one of said plurality of solder pads, and each being larger in diameter than the solder balls, and having a coverable opening;

a solder ball gate associated with said placement tray, said solder ball gate covering the opening in said placement tray in a second position and uncovering said opening in a first position;

means associated with said placement tray and said solder ball gate for controlling movement of said solder ball gate; and a base seat disposed beneath said placement tray to position the multi-chip substrate between said base seat and said placement tray, said base seat having a plurality of alignment pins corresponding to said alignment holes and alignment cavities.

8. The solder ball placement and alignment apparatus as claimed in claim 7 further comprising a solder ball collection box disposed beneath said base seat for collecting solder balls.

9. The solder ball placement and alignment apparatus as claimed in claim 7, said means for controlling movement of said solder ball gate being mechanically interconnected to said gate and comprising a worm gear and a motor that drives said worm gear to move said gate between the first position and the second position.

10. The solder ball placement and alignment apparatus as claimed in claim 7, said placement tray including an extended portion extending in length beyond the multi-chip substrate, and said opening of said placement tray being located in said extended portion.

11. The solder ball placement and alignment apparatus as claimed in claim 7 wherein said means for controlling movement of said solder ball gate is programmed to move said solder ball gate at predetermined time intervals.

* * * * *